(12) United States Patent
Tamura

(10) Patent No.: US 7,407,862 B2
(45) Date of Patent: Aug. 5, 2008

(54) METHOD FOR MANUFACTURING FERROELECTRIC MEMORY DEVICE

(75) Inventor: Hiroaki Tamura, Shimosuwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/787,451

(22) Filed: Apr. 16, 2007

(65) Prior Publication Data

US 2007/0243640 A1 Oct. 18, 2007

(30) Foreign Application Priority Data

Apr. 17, 2006 (JP) .............................. 2006-113448

(51) Int. Cl.
*H01L 21/8242* (2006.01)
(52) U.S. Cl. ...................... 438/396; 438/3; 438/397; 438/398; 438/399; 438/665
(58) Field of Classification Search ................ 438/396, 438/397, 398, 399
See application file for complete search history.

(56) References Cited

FOREIGN PATENT DOCUMENTS

JP 2000-277701 10/2000

*Primary Examiner*—Taghi T. Arani
*Assistant Examiner*—Julia Slutsker
(74) *Attorney, Agent, or Firm*—Harness, Dickey & Pierce, P.L.C.

(57) ABSTRACT

A method for manufacturing a ferroelectric memory device includes the steps of forming an active element on a substrate; forming an interlayer dielectric film on the substrate; forming a contact hole in the interlayer dielectric film; forming, in the contact hole, a contact plug that conductively connects to the active element; reacting trimethyl aluminum with the contact plug; applying an oxidation treatment to the contact plug reacted with the trimethyl aluminum; applying an ammonium plasma treatment to the contact plug treated with the oxidation treatment; forming a film of conductive material having a self-orientation property to form a conductive layer on the contact plug treated with the ammonium plasma treatment; and laminating a first electrode, a ferroelectric layer and a second electrode above the conductive layer.

7 Claims, 4 Drawing Sheets

METHOD FOR MANUFACTURING FERROELECTRIC MEMORY DEVICE

The entire disclosure of Japanese Patent Application No. 2006-113448, filed Apr. 17, 2006 is expressly incorporated by reference herein.

BACKGROUND

1. Technical Field

The present invention relates to a method for manufacturing a ferroelectric memory device.

2. Related Art

A ferroelectric memory device (FeRAM) is a nonvolatile memory that is capable of low-voltage and high-speed operation, and its memory cell can be composed with one transistor and one capacitor (1T/1C). Accordingly, ferroelectric memory devices can be integrated to the level of integration of DRAMs, and therefore are highly expected as large-capacity nonvolatile memories.

In order for a ferroelectric capacitor composing a ferroelectric memory device to exhibit its ferroelectric characteristics to the full, the crystal orientation of each layer composing the ferroelectric capacitor is very important. Japanese laid-open patent application JP-A-2000-277701 is an example of related art.

SUMMARY

In accordance with an advantage of some aspects of the present invention, it is possible to provide a method for manufacturing a ferroelectric memory device, which can excellently control the crystal orientation of each layer composing a ferroelectric capacitor.

In accordance with an embodiment of the invention, a method for manufacturing a ferroelectric memory device includes the steps of: forming an active element on a substrate; forming an interlayer dielectric film on the substrate; forming a contact hole in the interlayer dielectric film; forming, in the contact hole, a contact plug that conductively connects to the active element; reacting trimethyl aluminum with the contact plug; applying an oxidation treatment to the contact plug reacted with the trimethyl aluminum; applying an ammonium plasma treatment to the contact plug treated with the oxidation treatment; forming a film of conductive material having a self-orientation property to form a conductive layer on the contact plug treated with the ammonium plasma treatment; and laminating a first electrode, a ferroelectric layer and a second electrode above the conductive layer.

According to the manufacturing method described above, the ammonium plasma treatment favorably gives the desired effect on the contact plug, such that the orientation of the contact layer on the contact plug can be favorably controlled, and the orientation of the first electrode formed on the conductive layer, and consequentially the ferroelectric layer can be favorably controlled. As a result, the ferroelectric layer having a specified crystal orientation can be obtained, such that a ferroelectric memory device with excellent ferroelectric characteristics can be provided.

For conductive material having a self-orientation property to improve its self-orientation property, the surface condition of a base on which the conductive material is deposited is important. For example, by applying an ammonium plasma treatment to the surface of the base, the self-orientation property of the conductive material can be improved. However, the surface reforming effect given by the ammonium plasma treatment is small on the contact plug having conductivity, compared to the interlayer dielectric film. Therefore, by merely applying an ammonium plasma treatment to an interlayer dielectric film that includes a contact plug, the surface reforming effect is small on the contact plug such that the self-orientation property of the conductive material to be formed thereon may not be sufficiently attained. In accordance with the present embodiment of the invention, trimethyl aluminum is reacted with the contact plug to generate —O—Al—$CH_3$ bonds, an oxidation treatment is applied to the bonds to thereby generate —O—Al—OH bonds, and an ammonium plasma treatment is applied thereto. As a result, the conductive material formed on the contact plug exhibits a very high level of self-orientation property, and therefore the conductive layer having a high level of orientation is formed. It is considered that this result is obtained because —O—Al—O—NH bonds are favorably generated on the contact plug, because the ammonium plasma treatment is conducted after the reaction with trimethyl aluminum and the oxidation treatment have been conducted. In other words, it is considered that, through generating OH bases on the contact plug prior to an ammonium plasma treatment, and then conducting the ammonium plasma treatment, —O—Al—O—NH bonds are sufficiently generated on the surface of the contact plug, such that the migration effect of the conductive material film that is formed thereafter is promoted.

It is noted that, by forming the first electrode on the conductive layer oriented in a predetermined crystallographic axis due to the self-orientation property, the first electrode would have a crystal orientation that reflects the surface structure of the base conductive layer, and the ferroelectric layer that is formed further above would also have a crystal orientation that reflects the crystal structure of the first electrode. In other words, by forming the conductive layer after the surface of the contact plug has been effectively reformed by the ammonium plasma treatment, crystals of the conductive layer are oriented, and crystals of the first electrode and the ferroelectric layer formed thereon are favorably oriented.

In the manufacturing method described above, in the step of forming the contact plug, tungsten may be used as a material for forming the contact plug. When tungsten is used as a material for forming the contact plug, mere application of an ammonium plasma treatment to the contact plug does not cause sufficient self-orientation of a conductive material to be formed on the contact plug. Therefore, in accordance with the present embodiment, an ammonium plasma treatment is conducted after the contact plug composed of tungsten has been reacted with trimethyl aluminum and treated with an oxidation treatment, whereby the surface of the contact plug composed of tungsten can be favorably reformed, and the degree of self-orientation of a conductive material to be deposited thereon can be improved higher.

Also, in the manufacturing method in accordance with the present embodiment, in the step of reacting with trimethyl aluminum, the trimethyl aluminum reacts with the contact plug, whereby —O—Al—$CH_3$ bonds are generated on the contact plug. By generating such bonds, —O—Al—OH bonds can be introduced by an oxidation treatment to be conducted later, and then —O—Al—O—NH bonds can be favorably introduced by an ammonium plasma treatment.

Also, the step of conducting an oxidation treatment may include reacting the contact plug with water. The oxidation treatment with water is difficult to cause a trouble of oxidizing tungsten, and therefore is difficult to cause a trouble of increasing a resistance value of the contact plug.

Also, in the step of forming the conductive layer, titanium may be used as the conductive material having a self-orientation property. Titanium particularly excels in self-orientation property, and therefore is an optimum material as the conductive material in accordance with the present embodiment. Concretely, titanium is formed oriented in a <001> axis. It is noted that the formed titanium layer may be nitrided to form a titanium nitride layer, and this layer can be used as the conductive layer. In this case, the titanium nitride layer composing the conductive layer is formed to have an orientation in an (111) orientation.

Further, the manufacturing method in accordance with the present embodiment may include forming, on the conductive layer composed of titanium or titanium nitride, a barrier layer that exhibits barrier property against oxygen. By forming such a barrier layer, oxidation of the contact plug formed in the substrate can be prevented or suppressed. It is noted that the barrier layer may be composed of a compound that is expressed by, for example, $Ti_{(1-x)}Al_xN_y$ ($0<x\leq0.3$, $0<y$). The compound would have a (111) crystal orientation, reflecting the orientation of the underlying conductive layer (a titanium layer or titanium nitride layer), and the first electrode formed above would have a predetermined plane orientation, reflecting the orientation of the barrier layer.

It is noted that the first electrode and the second electrode may be formed from, for example, iridium, platinum, ruthenium, iridium oxide, ruthenium oxide, or platinum alloy. Also, the ferroelectric layer may be formed from perovskite type oxide including, for example, lead zirconate titanate (Pb (Zr, Ti)$O_3$ (hereafter abbreviated as PZT)), or bismuth layer compound such as $SrBi_2Ta_2O_9$ or the like.

When forming a titanium layer and then nitriding the titanium layer, these steps may preferably be conducted after forming the first electrode, and before forming the ferroelectric layer. This is because the orientation of the first electrode can be improved by the effect of annealing at the time of the nitrization treatment. Also, if the steps were conducted after forming the ferroelectric layer, the ferroelectric layer may be damaged by annealing, and its ferroelectric characteristics may be deteriorated. It is noted that, when the titanium layer is not nitrided, the thickness of the titanium layer may preferably be 5 nm or less. This is because the resistance value can be retained low even when the titanium layer is oxidized.

DESCRIPTION OF EXEMPLARY EMBODIMENTS

Preferred embodiments of the invention are described below with reference to the accompanying drawings.

Ferroelectric Memory Device

Figure 1:
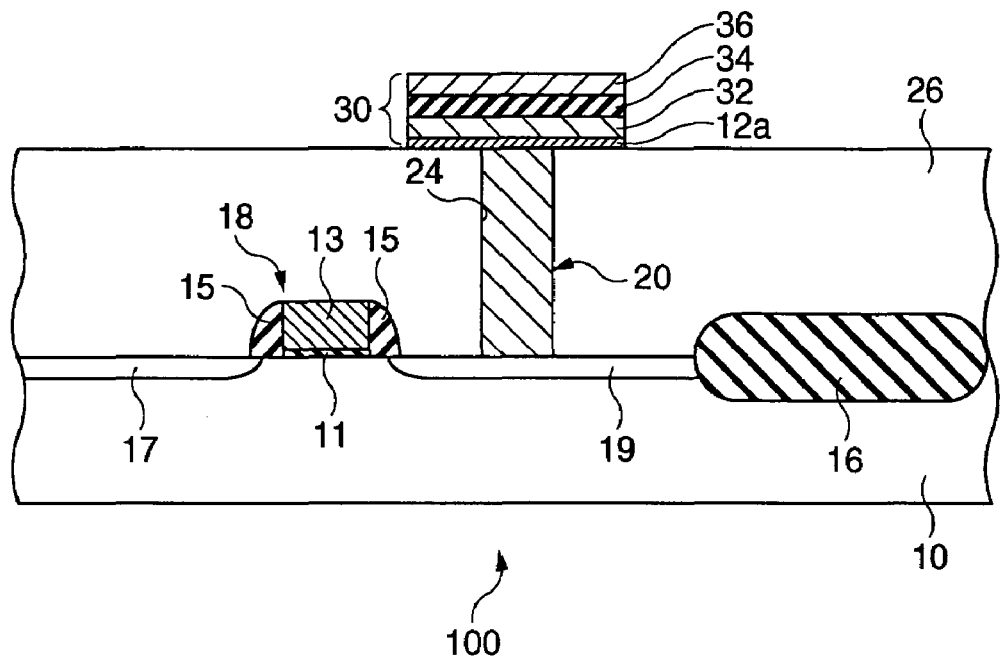
FIG. 1 is a schematic cross-sectional view of a ferroelectric memory device in accordance with an embodiment of the invention.

FIG. 1 is a cross-sectional view schematically showing a ferroelectric memory device 100 manufactured by a manufacturing method in accordance with an embodiment of the invention. As shown in FIG. 1, the ferroelectric memory device 100 includes a ferroelectric capacitor 30, a contact plug 20, and a switching transistor 18 for the ferroelectric capacitor 30, formed above a semiconductor substrate 10. It is noted that, although the present embodiment is described with reference to a 1T/1C type memory cell, the applicability of the invention is not limited to a 1T/1C type memory cell.

The transistor 18 includes a gate dielectric layer 11, a gate conductive layer 13 provided on the gate dielectric layer 11, and first and second impurity regions 17 and 19 that define source/drain regions. Also, the plug 20 is electrically connected to the switching transistor 18, and adjacent transistors (illustration omitted) are isolated from one another by an element isolation region 16.

The ferroelectric capacitor 30 includes a titanium nitride layer 12a, a first electrode 32 laminated on the titanium nitride layer 12a, a ferroelectric layer 34 laminated on the first electrode 32, and a second electrode 36 laminated on the ferroelectric layer 34. Also, the ferroelectric capacitor 30 is provided on the plug 20 that is provided in a dielectric layer 26.

The plug 20 is formed on the second impurity region 18, and formed from a plug conductive layer 22 provided inside an opening section (contact hole) 24. The plug conductive layer 22 is composed of a high melting point metal, such as, for example, tungsten, molybdenum, tantalum, titanium, nickel or the like, and may preferably be composed of tungsten. It is noted that a top surface of the plug 20 is treated by an ammonium plasma treatment, whereby a single molecule layer having —O—Al—O—NH bonds is formed on the surface (see FIG. 7). Because the single molecule layer having —O—Al—O—NH bonds is formed, titanium to be deposited on the plug 20 has a higher level of self-orientation property, and the crystal orientation of the conductive layer composed of the titanium is improved to a higher level.

The titanium nitride layer (conductive layer) 12a is formed on the plug 20 in a manner to be electrically conductive with the plug conductive layer 22 of the plug 20, and has a function to control the crystal orientation of its upper layers, the first electrode 32 and consequentially the ferroelectric layer 34. It is noted that the titanium nitride layer 12a is formed by applying a nitriding treatment to a titanium layer oriented in a <001> axis, and has an orientation in a (111) orientation (see FIG. 2). It is noted that, for controlling the crystal orientation of the first electrode 32 and the ferroelectric layer 34, a base layer (i.e., the conductive layer) may be formed from a titanium layer having a (001) plane orientation, instead of the titanium nitride layer 12a. By such a base layer (i.e., the conductive layer) composed of a titanium layer, the control of orientation of the first electrode 32 can also be manifested.

It is noted that, in the present embodiment, by forming the first electrode 32 on the titanium nitride layer 12a, the orientation is controlled. However, an intermediate layer may be provided between the titanium nitride layer 12a and the first electrode 32. For example, a barrier layer having an oxygen barrier property for the plug 20 may be formed. The barrier layer may be composed of a material having crystalline, conductivity, and oxygen barrier property, without any particular limitation, but its crystalline may preferably have a (111) orientation. Because the first electrode 32 having a crystal orientation reflecting the crystal orientation of the barrier layer 14 can be formed above the barrier layer 14, the crystal orientation of the first electrode 32 can be made in a (111) orientation. As the constituent material of the barrier layer 14, for example, TiAlN, TiAl, TiSiN, TiN, TaN and TaSiN may be enumerated. Above all, the barrier layer 14 may preferably be composed of a layer that includes titanium, aluminum and nitrogen (e.g., TiAlN). When the barrier layer 14 is composed of TiAlN, and the composition (atom ratio) of titanium, aluminum and nitrogen in the barrier layer 14 is expressed by a chemical formula of $Ti_{(1-x)}Al_xN_y$, in a preferred embodiment, x may be in a range of $0<x\leq0.3$, and y may be greater than 0 ($0<y$).

The first electrode 32 may be formed from at least one kind of metal selected from platinum, ruthenium, rhodium, palladium, osmium and iridium, an oxide or an alloy of the aforementioned metal. Preferably, the first electrode 32 may be composed of platinum or iridium, and may more preferably be composed of iridium. Also, the first electrode 32 may be formed from a single layer film, or a multilayer film of laminated layers. When the first electrode 32 is composed of crystalline, the crystal orientation of the first electrode 32 and the crystal orientation of the titanium nitride layer 12a may preferably have an epitaxial orientation relation at an interface at which they are in contact with each other. In this case, the crystal orientation of the ferroelectric layer 34 and the crystal orientation of the first electrode 32 may also preferably have an epitaxial orientation relation at an interface at which they are in contact with each other.

Figure 2:
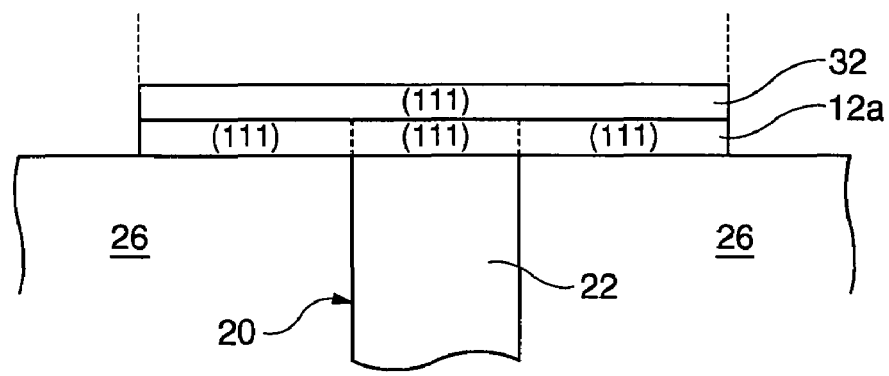
FIG. 2 is a cross-sectional view schematically showing orientation states in a main area of the ferroelectric memory device shown in FIG. 1.

As shown in FIG. 2, when the titanium nitride layer 12a belongs to a cubic system, and its crystal orientation is in <111> orientation, the crystal orientation of the first electrode 32 may preferably be in a (111) orientation. By this composition, when the ferroelectric layer 34 is formed on the first electrode 32, the crystal orientation of the ferroelectric layer 34 can be readily made in a (111) orientation.

The ferroelectric layer 34 is composed with a ferroelectric material. The ferroelectric material has a perovskite crystal structure and may be expressed by a general formula of $A_{1-b}B_{1-a}X_aO_3$. It is noted that A includes Pb. It is noted that a part of Pb may be replaced with La. B is composed of at least one of Zr and Ti. X is composed of at least one of V, Nb, Ta, Cr, Mo, W, Ca, Sr and Mg. As the ferroelectric material included in the ferroelectric layer 34, any known material that can be used as a ferroelectric layer can be used, for example, ($Pb(Zr,Ti)O_3$) (PZT), $SrBi_2Ta_2O_9$ (SBT) or $(Bi,La)_4Ti_3O_{12}$ (BLT) may be enumerated. Above all, as the material of the ferroelectric layer 34, PZT is preferred, and in this case, the first electrode 32 may preferably be composed of iridium, in view of the device reliability.

When PZT is used as the material of the ferroelectric layer 34, the content of titanium in the PZT may preferably be greater than the content of zirconium in order to obtain a greater amount of spontaneous polarization. The PZT having such a composition belongs to a tetragonal system, and its spontaneous polarization axis is the [001]. In this case, an [100] orientation component that is perpendicular to the [001] concurrently exists, such that, when the PZT is oriented in the [001], its ferroelectric characteristics may be degraded because the [100] orientation component does not contribute to polarization reversal. In contrast, by forming the crystal orientation of the PZT that is used in the ferroelectric layer 34 in a <111> axis, the a-axis can be oriented in a direction that is off set through a certain angle from the normal line of the substrate. In other words, the polarization axis has a component in the direction of the normal line of the substrate, which can contribute to polarization reversal. Therefore, when the ferroelectric layer 34 is composed of PZT, and the amount of titanium content in the PZT is greater than the amount of zirconium content, the crystal orientation of the PZT may preferably be in a <111> axis, because its hysteresis characteristic is excellent.

The second electrode 36 may be formed from the material exemplified above as the material that can be used as the first electrode 32, or may be formed from aluminum, silver, nickel or the like. Also, the second electrode 36 may be formed from a single layer film, or a multilayer film of laminated layers. Preferably, the second electrode 36 may be formed from platinum, or a laminated film of iridium oxide and iridium layers.

For manufacturing the ferroelectric memory device 100 in accordance with the present embodiment having the composition described above, an ammonium plasma treatment is applied to the surface of the plug 20, thereby forming a single molecule layer having —O—Al—O—NH bonds, a titanium layer is then formed on the plug 20, and the titanium layer is nitrided to form the titanium nitride layer 12a. By adopting such a manufacturing process, the degree of crystal orientation of the titanium nitride layer 12a can be improved higher, and the crystal orientation property of the first electrode 32 and the ferroelectric layer 34 can be controlled. As a result, the ferroelectric memory device 100 is provided with excellent ferroelectric characteristics.

Method For Manufacturing Ferroelectric Memory Device

Next, an example of a method for manufacturing the ferroelectric memory device 100 shown in FIG. 1 is described with reference to the accompanying drawings. FIGS. 3A through 3D, and FIGS. 4A through 4E are cross-sectional views schematically showing steps of a method for manufacturing the ferroelectric memory device 100 shown in FIG. 1. It is noted that, in FIGS. 3A through 4E, illustration of parts of the composition among the ferroelectric memory device 100 in FIG. 1 may be omitted, and details of such omitted parts should be referred to in FIG. 1.

The method for manufacturing the ferroelectric memory device 100 in accordance with the present embodiment includes the steps of: forming a transistor (active element) 18 on a substrate 10; forming an interlayer dielectric film 26 on the substrate 10 including the transistor 18; forming a contact hole 24 in the interlayer dielectric film 26; forming a plug 20 in the contact hole 24; reacting trimethyl aluminum with a surface of the plug 20; applying an oxidation treatment to the surface of the plug 20 after the reaction; applying an ammonium plasma treatment to the surface of the plug 20 after the oxidation treatment; forming a titanium nitride layer 12a on the plug 20 after the ammonium plasma treatment; and forming a ferroelectric capacitor 30 above the titanium nitride layer 12a. It is noted that the step of forming the titanium nitride layer 12a includes the step of forming a titanium layer 112a above the interlayer dielectric film 26 including the plug 20, and the step of changing the titanium layer 112a to the titanium nitride layer 12a.

Figure 3A:
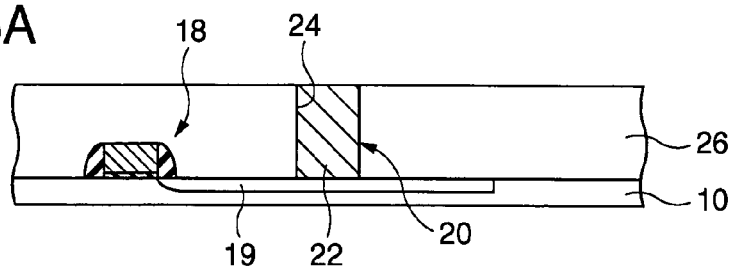
FIGS. 3A-3D are cross-sectional views schematically showing steps of a method for manufacturing the ferroelectric memory device shown in FIG. 1.

First, as shown in FIG. 3A, a transistor (active element) 18 and first and second impurity regions 17 and 19 (part of illustration omitted) that define source and drain regions are formed on a substrate 10, and an interlayer dielectric film 26 is formed on the substrate 10 including the transistor 18. Then, an opening section (contact hole) 24 is formed in the interlayer dielectric film 26 by dry etching or the like, and a plug 20 is formed by embedding a plug conductive layer 22 conductively connected to the transistor 18 inside the opening section 24. The plug conductive layer 22 may be embedded by, for example, a CVD method or a sputter method. Portion of the plug conductive layer 22 deposited on the top surface of the dielectric layer 26 is removed by, for example, chemical mechanical polishing, whereby the plug 22 is formed. It is noted that the interlayer dielectric film 26 is formed from a silicon oxide film, and the plug conductive layer 22 is composed of tungsten.

Figure 3B:
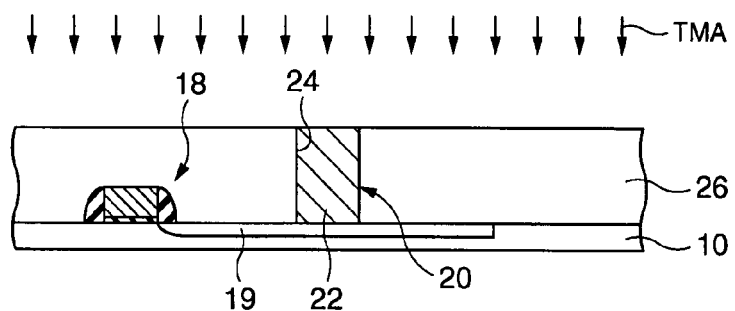
Figure 5:
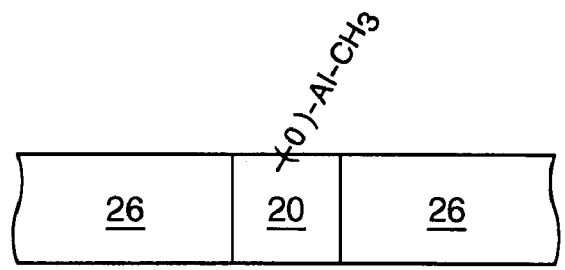
FIG. 5 is a figure for describing the effect of the trimethyl aluminum treatment.

Next, as shown in FIG. 3B, a trimethyl aluminum (TMA) treatment is applied to the surface of the plug 20 and the interlayer dielectric film 26. The substrate temperature at the time of the TMA treatment may preferably be between 150° C. and 400° C. In a low temperature below 150° C., the TMA raw material coagulates on the substrate, and does not form a single molecule layer. On the other hand, in a high temperature over 400° C., the TMA is decomposed on the substrate. This state is similar to a so-called mere "thermal CVD mode," and the TMA is not formed in a single molecule layer. By the TMA treatment, a single molecular layer composed of —O—Al—CH$_3$ bonds as shown in FIG. 5 is formed on the surface of the plug 20. The TMA treatment in accordance with the present embodiment may be conducted through, for example, disposing the substrate including the plug 20 in a treatment chamber, and introducing TMA gas in the chamber. Before the TMA gas is introduced, H$_2$O gas may preferably be introduced, to thereby form —OH bonds on the surface of the plug 20. This is because —OH bonds formed on the surface act as absorption sites of the TMA.

Figure 3C:
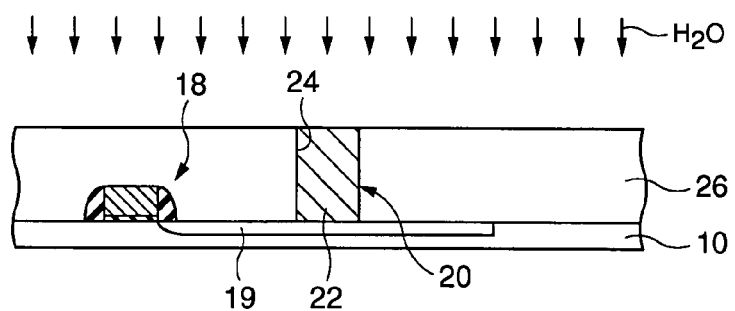
Figure 6:
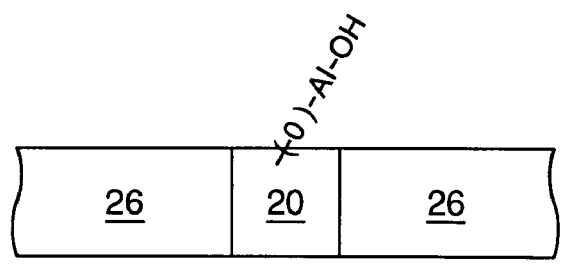
FIG. 6 is a figure for describing the effect of the oxidation treatment.

Next, as shown in FIG. 3C, an oxidation treatment is applied to the surface of the TMA treated surface, in other words, the surface of the plug 20 and the interlayer dielectric layer 26. By the oxidation treatment, the —O—Al—CH$_3$ bonds on the surface of the plug 20 change to —O—Al—OH bonds as shown in FIG. 6. The oxidation treatment in accordance with the present embodiment may be conducted through, for example, disposing the substrate 10 including the plug 20 in a treatment chamber, and then introducing argon or nitrogen gas containing H$_2$O in the chamber. Besides H$_2$O gas, for example, ozone, or H$_2$O$_2$ may be used. The oxidation treatment can be conducted after purging the TMA gas from the chamber where the TMA treatment has been conducted.

Figure 3D:
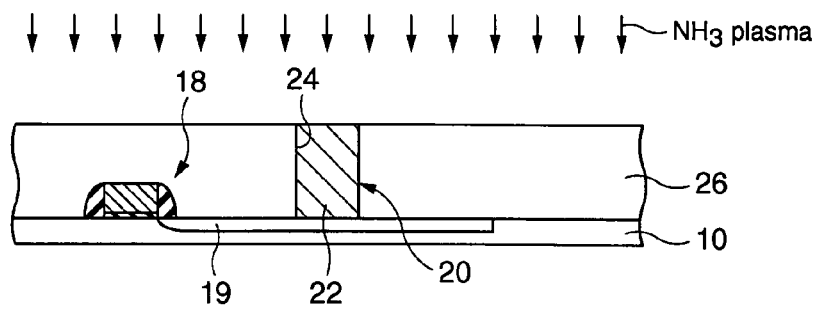
Figure 7:
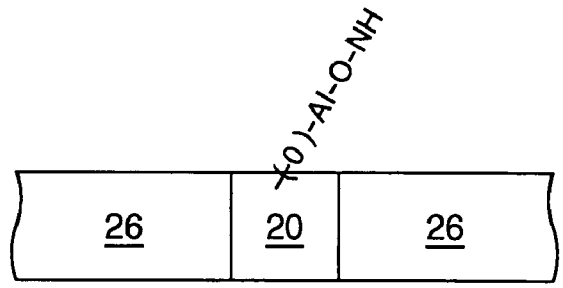
FIG. 7 is a figure for describing the effect of the ammonium plasma treatment.

Furthermore, as shown in FIG. 3D, an ammonium plasma treatment (NH$_3$ plasma treatment) is applied to the surface that has been treated with the oxidation treatment, in other words, the surface of the plug 20 and the interlayer dielectric film 26. By applying the NH$_3$ plasma treatment, the —O—Al—OH bonds on the surface of the plug 20 change to —O—Al—O—NH bonds, as shown in FIG. 7. The NH$_3$ plasma treatment in accordance with the present embodiment is conducted through, for example, exiting plasma of ammonium gas, and irradiating the plasma to the surface of the interlayer dielectric film 26 including the plug 20. The ammonium plasma treatment may be conducted under a condition with, for example, a flow quantity of ammonium gas introduced in a chamber being 350 sccm, a pressure inside the chamber being 1 Torr, a substrate temperature being 400° C., a high-frequency source power at 13.56 MHz supplied to the substrate being 100 W, a high-frequency source power at 350 kHz supplied to the plasma generation area being 55 W, a distance between the electrode and the substrate being 350 mils, and a plasma irradiation time being 60 seconds.

Figure 4A:
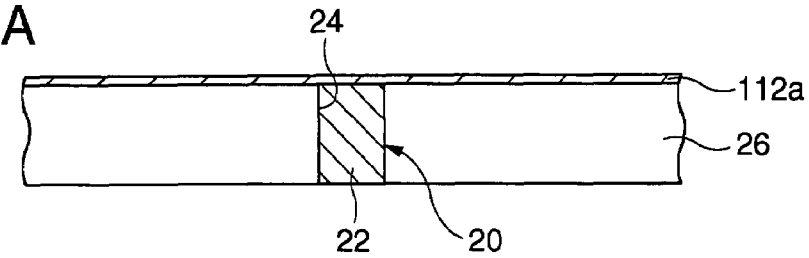
FIGS. 4A-4E are cross-sectional views schematically showing steps of the method for manufacturing the ferroelectric memory device succeeding FIG. 3D.

After conducting the surface treatment described above, a titanium layer 112a is formed on the dielectric layer 26 and the plug 20, as shown in FIG. 4A. The titanium layer 112a may be formed by, for example, a sputter method or a CVD method. Titanium generally is high in self-orientation property, and when formed in a film by a sputter method or a CVD method, titanium forms a layer in a hexagonal close-packed structure having a (001) orientation. Accordingly, the titanium layer 112a exhibits a (001) orientation due to its self-orientation.

Figure 4B:
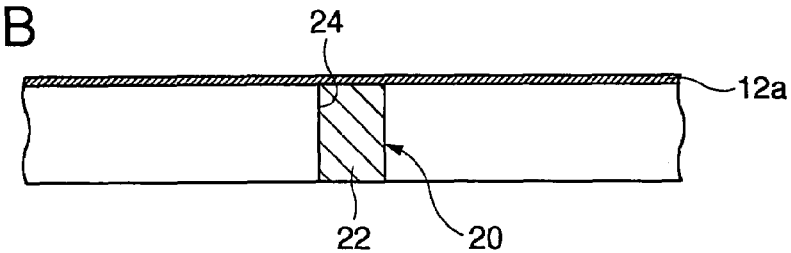

Then, a nitriding treatment is applied to the formed titanium layer 112a, thereby changing the titanium layer 112a to a titanium nitride layer 12a (FIG. 4B). More concretely, a heat treatment (at 500° C.-650° C.) is conducted in an atmosphere including nitrogen, whereby the titanium layer 112a is nitrided. When the heat treatment temperature exceeds over 650° C., the characteristics of the transistor 18 may be affected. On the other hand, when the heat treatment temperature is below 500° C., it takes too long to nitride the titanium layer 112a, which is not favorable. It is noted that the formed titanium nitride layer 12a has a (111) orientation.

Figure 4C:
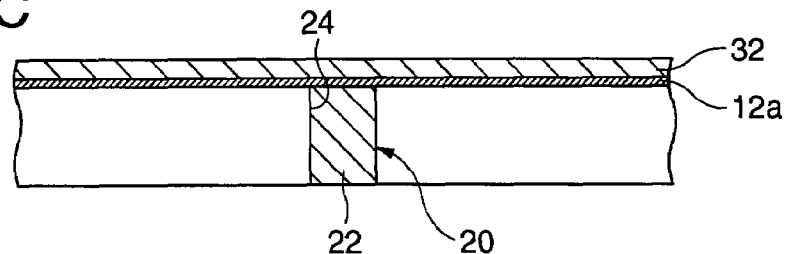

Further, as shown in FIG. 4C, a first electrode 32 is formed on the titanium nitride layer 12a. It is noted that, by forming the first electrode 32 on the crystalline titanium nitride layer 12a, the crystallinity of the first electrode 32 considerably improves, and the crystal orientation of the titanium nitride layer 12a can be reflected on the first electrode 32. For example, when the crystal orientation of the titanium nitride layer 12a is in a <111> axis, the first electrode 32 can be formed to have a (111) orientation. The film forming method for forming the first electrode 32 may be appropriately selected depending on its material. For example, a sputter method or a CVD method may be enumerated.

Figure 4D:
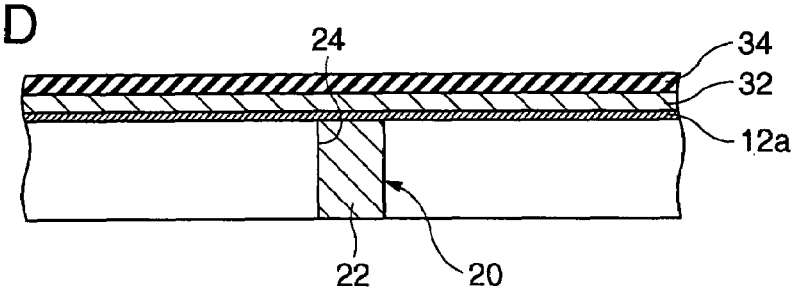

After forming the first electrode 32, a ferroelectric layer 34 is formed on the first electrode 32, as shown in FIG. 4D. By forming the ferroelectric layer 34 on the first electrode 32, the crystal orientation of the first electrode 32 can be reflected on the ferroelectric layer 34. For example, when at least a part of the first electrode 32 is crystalline having a (111) orientation, the ferroelectric layer 34 can be formed in a (111) crystal orientation. The film forming method for forming the ferroelectric layer 34 may be appropriately selected depending on its material. For example, a spin-on method, a sputter method or a MOCVD method may be enumerated.

Figure 4E:
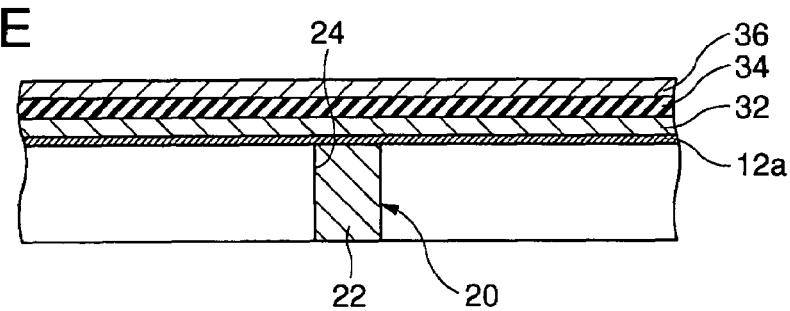

Then, as shown in FIG. 4E, a second electrode 36 is formed on the ferroelectric layer 34. The film forming method for forming the second electrode 36 may be appropriately selected depending on its material. For example, a sputter method or a CVD method may be enumerated. Then, a resist layer having a predetermined pattern is formed on the second electrode 36. By using the resist layer as a mask, patterning is conduced by a photolithography method. By this, a ferroelectric memory device 100 including a ferroelectric capacitor 30 in a stacked type can be obtained (see FIG. 1). The ferroelectric capacitor 30 included in the ferroelectric memory device 100 has the first electrode 32 provided on the titanium nitride layer 12a, the ferroelectric layer 34 provided on the first electrode 32, and the second electrode 36 provided on the ferroelectric layer 34.

The manufacturing method for manufacturing the ferroelectric memory device 100 in accordance with the present embodiment described above provides the following effects.

Because the ammonium plasma treatment gives the desired effect on the plug 20, the orientation of the titanium nitride layer 12a on the plug 20 can be favorably controlled, and the orientation of the first electrode 32 formed on the titanium nitride layer 12a, and consequentially the orientation of the ferroelectric layer 34 can be favorably controlled. As a result, the ferroelectric layer 34 having a predetermined crystal orientation can be obtained, such that ferroelectric characteristics of a ferroelectric memory device 100 to be manufactured can be improved.

It is noted that, when a conductive material having a self-orientation property is formed, the self-orientation of the conductive material can be improved to a higher level by applying an ammonium plasma treatment to a base of the conductive material. However, the surface reforming effect given by the ammonium plasma treatment is rather small on the plug 20 having conductivity, compared to the interlayer dielectric film 26. Therefore, by merely applying an ammonium plasma treatment to the interlayer dielectric film 26 including the plug 20, the surface reforming effect is small on the plug 20, and therefore the self-orientation property of the conductive material formed thereon may not be sufficiently exhibited.

Therefore, in accordance with the present embodiment of the invention, trimethyl aluminum is reacted with the plug 20 as a pre-treatment to generate —O—Al—CH$_3$ bonds, an oxidation treatment is applied to the bonds to thereby generate —O—Al—OH bonds, and then an ammonium plasma treatment is applied. As a result, the conductive material (titanium) formed on the plug 20 exhibits a very high level of self-orientation property, and therefore the titanium nitride layer 12a having a high level of orientation property is formed. It is considered that this result is obtained because —O—Al—O—NH bonds are favorably generated on the contact plug, because the ammonium plasma treatment is conducted after the reaction with trimethyl aluminum and the oxidation treatment have been conducted.

Preferred embodiments of the invention are described above in detail. However, the invention is not limited to the embodiments described above. For example, in the present embodiment, the first electrode 32 is formed on the titanium nitride layer 12a. However, a barrier layer having an oxygen barrier function may be formed between the titanium nitride layer 12a and the first electrode 32. The film forming method for forming the barrier layer may be appropriately selected according to its material. For example, a sputter method and a CVD method may be enumerated. The barrier layer may preferably be crystalline, and may preferably have a (111) orientation. When a barrier layer formed from a layer containing titanium, aluminum and nitrogen, the barrier layer may be composed of TiAlN having a (111) orientation. When the barrier layer has a (111) orientation, the crystal orientation of the first electrode 32 can be aligned in a (111) orientation. By this, the ferroelectric layer 34 that is formed on the first electrode 32 can be aligned in a <111> axis.

What is claimed is:

1. A method for manufacturing a ferroelectric memory device, the method comprising the steps of:
    forming an active element on a substrate;
    forming an interlayer dielectric film on the substrate;
    forming a contact hole in the interlayer dielectric film;
    forming, in the contact hole, a contact plug that conductively connects to the active element;
    reacting trimethyl aluminum with the contact plug;
    applying an oxidation treatment to the contact plug reacted with the trimethyl aluminum;
    applying an ammonium plasma treatment to the contact plug treated with the oxidation treatment;
    forming a film of conductive material having a self-orientation property to form a conductive layer on the contact plug treated with the ammonium plasma treatment; and
    laminating a first electrode, a ferroelectric layer and a second electrode above the conductive layer.

2. A method for manufacturing a ferroelectric memory device according to claim 1, wherein, in the step of forming the contact plug, tungsten is used as a material for forming the contact plug.

3. A method for manufacturing a ferroelectric memory device according to claim 1, wherein, in the step of reacting with trimethyl aluminum, the trimethyl aluminum reacts with the contact plug, whereby —O—Al—CH$_3$ bonds are generated on the contact plug.

4. A method for manufacturing a ferroelectric memory device according to claim 3, wherein, in the step of applying an oxidation treatment, the —O—Al—CH$_3$ bonds generated on the contact plug are changed to —O—Al—OH bonds by the oxidation treatment.

5. A method for manufacturing a ferroelectric memory device according to claim 4, wherein, in the step of applying an ammonium plasma treatment, the —O—Al—OH bonds generated on the contact plug change to —O—AM—O—NH bonds.

6. A method for manufacturing a ferroelectric memory device according to claim 1, wherein the step of applying an oxidation treatment includes reacting the contact plug with water.

7. A method for manufacturing a ferroelectric memory device according to claim 1, wherein, in the step of forming the conductive layer, titanium is used as the conductive material having a self-orientation property.

* * * * *